(12) United States Patent
Troia et al.

(10) Patent No.: US 11,348,655 B2
(45) Date of Patent: May 31, 2022

(54) MEMORY DEVICE WITH ANALOG MEASUREMENT MODE FEATURES

(71) Applicant: Micron Technology, Inc., Boise, ID (US)

(72) Inventors: Alberto Troia, Munich (DE); Antonino Mondello, Messina (IT)

(73) Assignee: Micron Technology, Inc., Boise, ID (US)

( * ) Notice: Subject to any disclaimer, the term of this patent is extended or adjusted under 35 U.S.C. 154(b) by 230 days.

(21) Appl. No.: 16/625,371

(22) PCT Filed: May 31, 2019

(86) PCT No.: PCT/IB2019/000479
§ 371 (c)(1),
(2) Date: Dec. 20, 2019

(87) PCT Pub. No.: WO2020/240236
PCT Pub. Date: Dec. 3, 2020

(65) Prior Publication Data
US 2021/0327526 A1    Oct. 21, 2021

(51) Int. Cl.
*G11C 29/16* (2006.01)
*G11C 29/32* (2006.01)
*G11C 29/02* (2006.01)
*G11C 29/36* (2006.01)

(52) U.S. Cl.
CPC ........... *G11C 29/32* (2013.01); *G11C 29/021* (2013.01); *G11C 29/16* (2013.01); *G11C 29/36* (2013.01); *G11C 2029/3202* (2013.01)

(58) Field of Classification Search
CPC ......... G11C 29/32; G11C 29/36; G11C 29/16; G11C 29/021; G11C 2029/3202
See application file for complete search history.

(56) References Cited

U.S. PATENT DOCUMENTS

| | | |
|---|---|---|
| 2005/0242980 A1 | 11/2005 | Collins et al. |
| 2005/0262492 A1* | 11/2005 | Goetting ........ G01R 31/318536 717/151 |
| 2007/0174527 A1* | 7/2007 | Vorenkamp ............. H04L 12/10 710/100 |
| 2008/0094101 A1* | 4/2008 | Balasubramanian ........ H03K 17/687 326/38 |
| 2009/0157340 A1 | 6/2009 | Gopalan et al. |
| 2012/0229169 A1 | 9/2012 | Nguyen et al. |

OTHER PUBLICATIONS

Partial International Search Report and Provisional Written Opinion from related International application No. PCT/IB2019/000479, dated Jan. 31, 2020, 18 pages.

* cited by examiner

*Primary Examiner* — Mohammed A Bashar
(74) *Attorney, Agent, or Firm* — Brooks, Cameron & Huebsch, PLLC

(57) ABSTRACT

The present disclosure relates to an apparatus, and a method for memory management and more a memory device structured with internal analogic measurement mode features. The memory device includes memory component having a memory array, a memory controller coupled to the memory component, a JTAG interface in the memory controller, voltage and current reference generators, and an analogic measurement block driven by the JTAG interface.

17 Claims, 9 Drawing Sheets

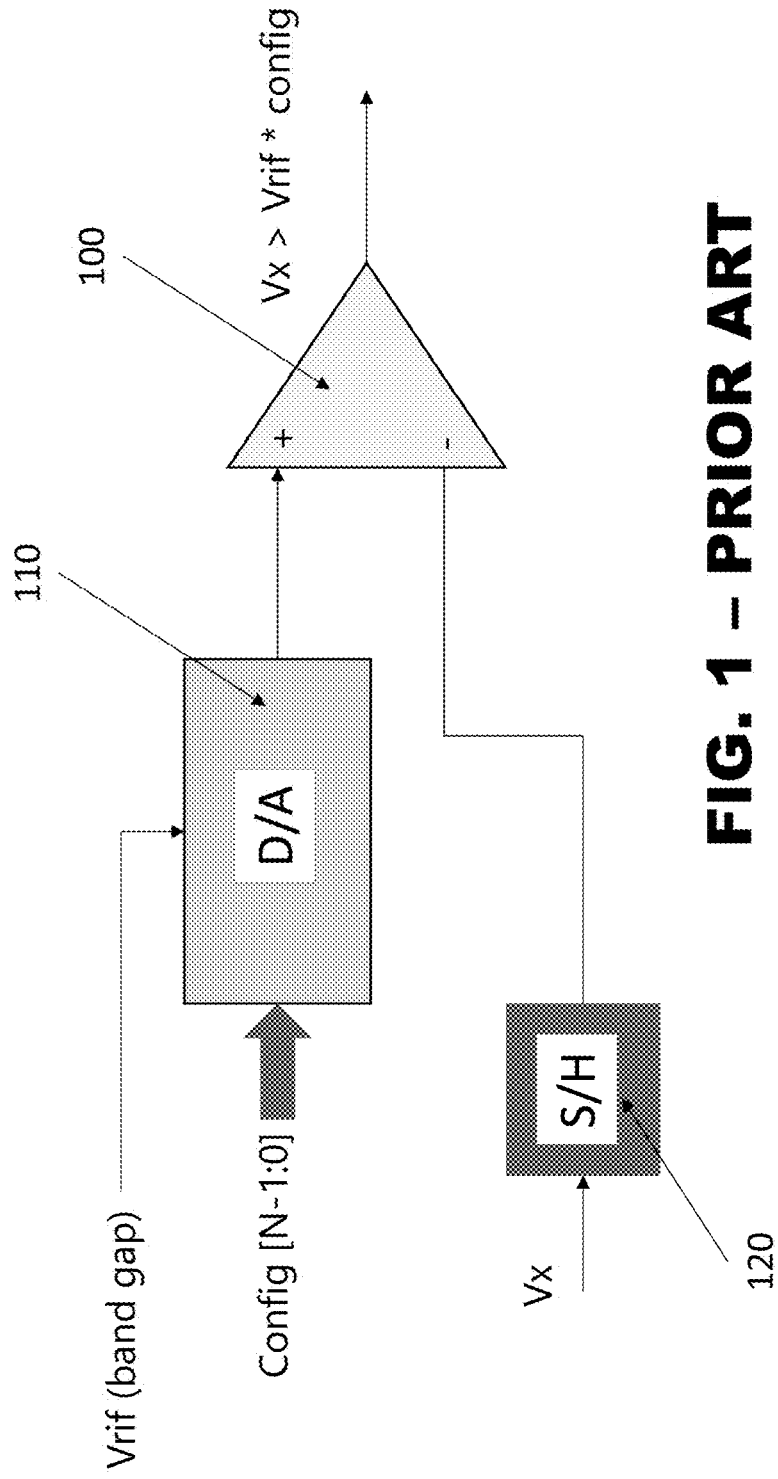
FIG. 1 – PRIOR ART

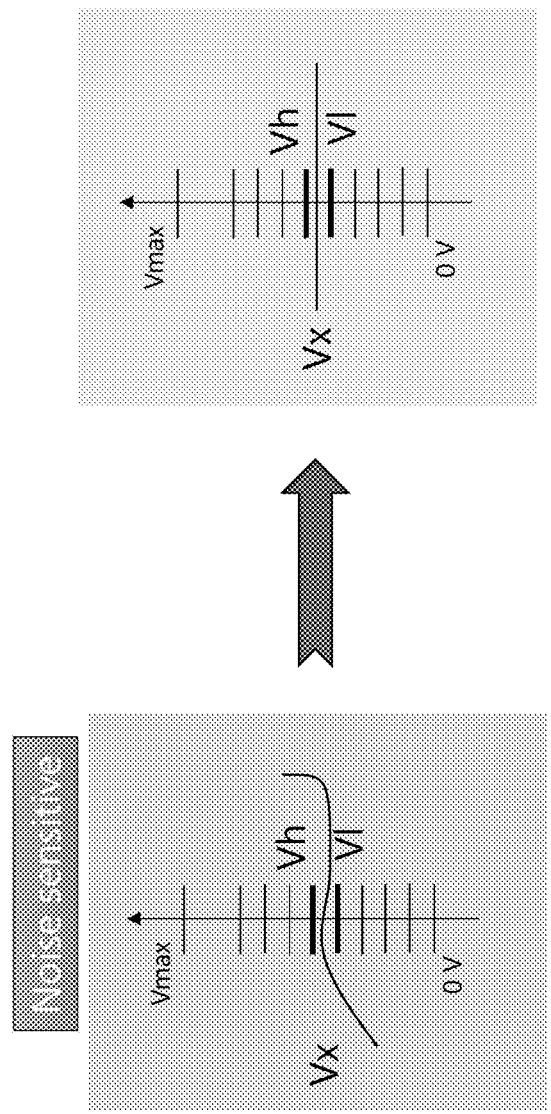

MEMORY DEVICE WITH ANALOG MEASUREMENT MODE FEATURES

PRIORITY INFORMATION

This application is a National Stage Application under 35 U.S.C. § 371 of International Application Number PCT/IB2019/000479, filed on May 31, 2019, the contents of which are incorporated herein by reference.

TECHNICAL FIELD

The present disclosure relates in general to apparatuses and methods for memory management and more particularly to a memory device structured with internal analogic measurement mode features. The memory device is a non-volatile memory component that is coupled to a host device or to a System-on-Chip.

BACKGROUND

Non-volatile Flash memories are today one of the fundamental building blocks in modern electronic systems, including the SoC devices for automotive applications, in particular for Real Time Operating Systems (RTOS). Their performance in terms of speed, consumption, alterability, nonvolatility and the increasing importance of system reconfigurability have pushed up to now for flash memory integration in System-on-Chip (SoC) devices.

However, with the current technologies the embedded memory portion is becoming the largest circuit portion in a SoC and it is not appropriate to increase their size to more than 128 Mbit since it is very difficult to manage the whole embedded memory structure when the lithography node is below 28 nm.

In many applications it would be highly desirable to enlarge the size of the memory portion but it would be necessary to provide a new manner of coupling the SoC and the embedded or associated memory component. Moreover, it would be necessary to provide a more efficient manner to exchange signals and measured values between the memory portion and the controller of the SoC.

In this respect a further need would be that of providing non-volatile memory devices including features for performing various measurements of the flash memory array. However, the measurement mode of a flash array can contain reserved operation that only the supplier of the component would like to use.

A JTAG protocol teaches already how to implement hardware and algorithms to perform proper memory measuring. However, conventional JTAG is relatively slow for memory devices having a large size.

Moreover, it would be highly desirable to provide internal analogic measurement mode features ensuring that only the right authority can access to specific measurement modes and/or to the update of the internal Flash array controller. The present disclosure is focused on the solution of the above-mentioned needs.

BRIEF DESCRIPTION OF THE DRAWINGS

FIG. 1 is a schematic view of a known digital low voltage detector for memory components realized according to a prior art solution;

FIG. 1A shows a first and a second diagram reporting a measurement of voltage value Vx affected by noise and more regular and stable value, respectively;

DETAILED DESCRIPTION

Figure 2A:
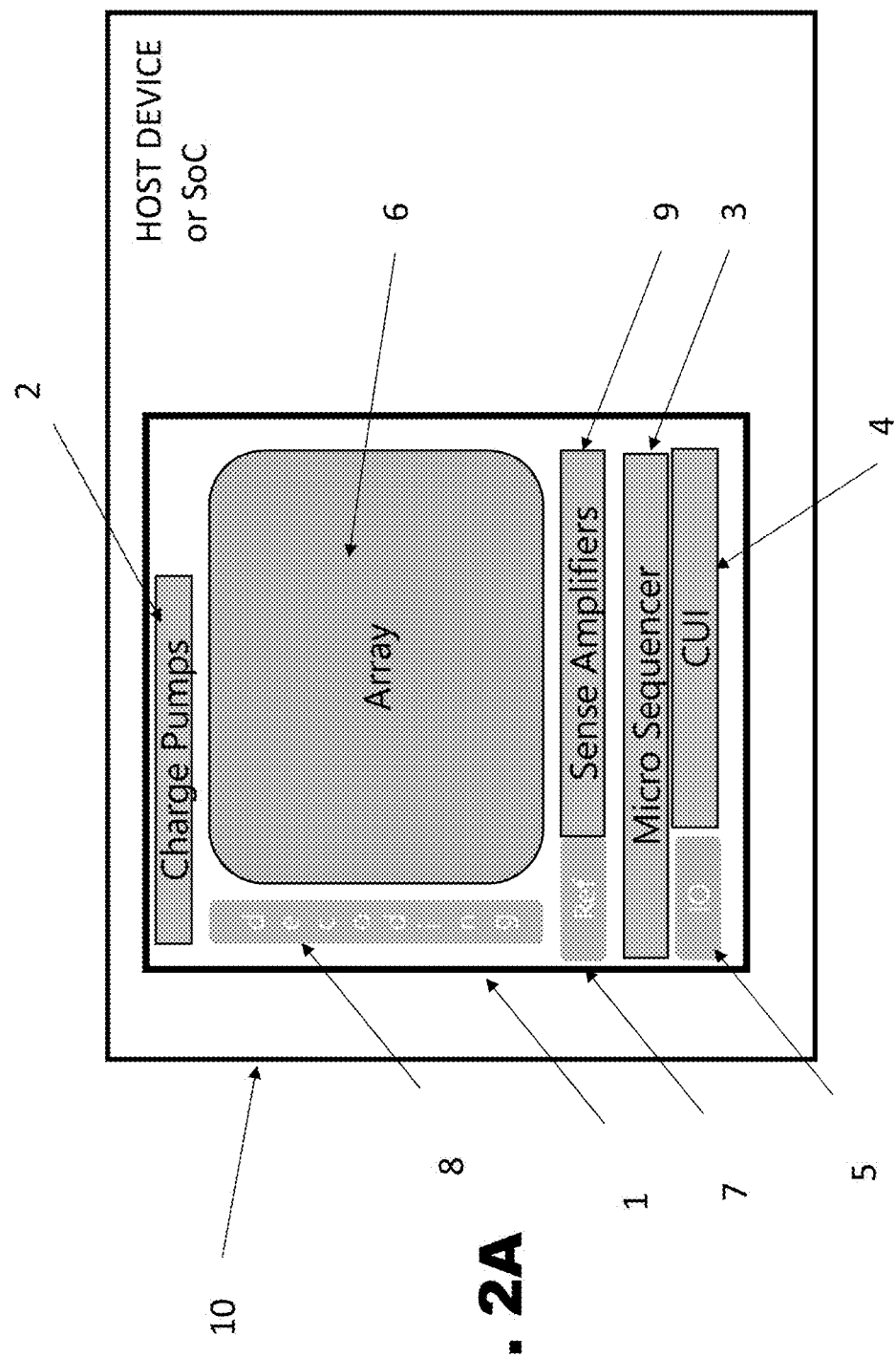
FIG. 2A shows a schematic view of a memory device associated to a host device or a System-on-Chip according to embodiments of the present disclosure.

In the following detailed description, reference is made to the accompanying drawings that form a part hereof and in which is shown, by way of illustration, specific embodiments. In the drawings, like numerals describe substantially similar components throughout the several views. Other embodiments may be disclosed and structural, logical, and electrical changes may be made without departing from the scope of the present disclosure. The following detailed description is, therefore, not to be taken in a limiting sense.

Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered.

Non-volatile memory is available in a wide variety of technologies, including flash memory (e.g., NAND and NOR), Read Only Memory (ROM), Electrically Erasable Programmable ROM (EEPROM), Erasable Programmable ROM (EPROM), and resistance variable memory such as phase change random access memory (PCRAM), self-selecting chalcogenide-based memories, resistive random access memory (RRAM), 3D XPoint memory (3DXP) and magneto-resistive random access memory (MRAM), among others.

Memory devices can include large arrays of memory cells for storing data, frequently organized into rows and columns. Individual memory cells and/or ranges of memory cells can be addressed by their row and column. When a memory array is addressed, there may be one or more layers of address translation, to e.g., translate between a logical address utilized by a host device and a physical address corresponding to a location in the memory array.

For the regular operation of the memory array it is necessary to provide to the memory measured voltage and current values for managing the reading, writing and erasing phases of the memory cells. Moreover, it would be highly desirable to provide internal analogic measurement mode features ensuring that only the right authority can access to specific measurement modes and/or to the update of the internal Flash array controller.

For a better understanding of the present disclosure, let's consider for instance a flash memory device coupled to a host device or associated to a SoC and including some circuit blocks shared with the SoC, for instance the read logic to implement the fetch/prefetch scheme and-or the branch prediction.

Some of these circuit blocks need to receive signals reporting voltage and/or current values detected in the memory component for correctly driving the reading, programming or erasing phases of the memory array More specifically, these circuit blocks need to have the power supply and signals advising that the power supply is correct. For instance, the signal can be a result of a comparison between a BandGap reference voltage, with proper voltage scale, and the external supply. This signal information is driven to the memory internal controller to execute correctly the required operation following a firmware. Similar consideration may be done with respect to a reference current.

The required voltage and/or current value are detected by specific circuit portions that operates as voltage or current detectors.

A Flash memory device is very sensitive to the power supply when it programs and erases the memory array in particular for data retention issues and for the reliability. The Flash array must be a very high reliable device able also to inform the SoC that something wrong is happening with the power supply. This task is assigned to a controller of the flash array (not shown) that is incorporated into the memory component.

Unfortunately, known standard voltage or current detectors are noise sensitive.

The current/voltage under measurement cannot be stable during the measurement time frame. Therefore, the measurement could be not accurate.

In some embodiments it is provided a voltage or current detector to be used in a memory component coupled to a host device or embedded/associated to a System-on-Chip having a low sensitivity to a possible noise disturbing the measurement.

In some cases the detector disclosed herewith provides just the value of the detected measurement protecting the manner in which the detector has obtained such a measurement, thus protecting the memory portion from possible hacker attack or reverse engineering in order to get some technological parameters.

A further feature of the detector of the present disclosure is given by the capability of generating reference voltage or currents according to the operating needs of the memory portion wherein the detector has been incorporated.

FIG. 1 shows a schematic example of a prior art solution for detecting a low voltage value in a memory portion, for instance a memory portion embedded in a complex System-on-Chip.

The detector shown in FIG. 1 is based on a Schmitt trigger comparator 100 receiving on one input the output of a digital to analogic or analog (D/A) converter 110.

This D/A converter 110 is coupled to a stable reference voltage potential Vrif generated for instance by an analogic bandgap generator with a proper configuration, i.e. a proper conversion factor, (not shown in the figures) and is driven by a digital input configuration signal Config.

According to the value of the digital input configuration signal the D/A converter 110 provides a modulated output value.

A sample and hold block 120 receives as input a voltage value Vx to be measured and applies its output to the other non-inverting input of the Schmitt trigger 110.

The Schmitt trigger is a comparator circuit with hysteresis implemented by applying positive feedback to the non-inverting input of a comparator or differential amplifier. It is an active circuit which converts an analog input signal to a digital output signal. The circuit is considered a trigger because the output retains its value until the input changes sufficiently to trigger a change. In the non-inverting configuration, when the input is higher than a chosen threshold, the output is high. When the input is below a different (lower) chosen threshold the output is low, and when the input is between the two levels the output retains its value.

The output obtained from the Schmitt trigger is the voltage value Vx>Vrif*Config.

This structure however is very sensitive to supply variations because of its intrinsic Schmidt trigger configuration.

For example, FIG. 1A shows a first diagram reporting the variations of the input voltage Vx because of the noise disturbing the measurement and a second diagram reporting a stable voltage value Vx that remains within a small range represented by a higher voltage value Vh and a lower voltage value Vl.

It would be desirable to obtain a stable measurement of the voltage value Vx as shown by the second diagram and the detector of the present disclosure is structured to obtain such a result.

Moreover, Flash array measuring needs some measurement modes that involves:

reference current generation;
reference voltage generation.

According to embodiments of the present disclosure an internal analogic measurement mode structure is implemented in a single analogic block 200 managed using the JTAG interface.

The analogic block 200 is substantially a hardware block incorporated into a circuit portion of a non-volatile memory device 1.

The memory device 1 is shown in FIG. 2A and includes an array 6 of Flash memory cells and a circuitry located around the memory array. The memory array 6 includes a non-volatile memory portion, NAND Flash or NOR Flash.

Such a memory device 1 is an independent structure but it is a component strictly associated to a host device 10 or to a System-on-Chip. More particularly, the memory device 1 is associated and linked to the SoC structure 10 partially overlapping such a structure while the corresponding semiconductor area of the SoC structure has been used for other logic circuits. The coupling between the SoC structure and the memory component is obtained by interconnecting a plurality of respective pads or pin terminals that are faced one toward the other (not shown).

The pads of the memory component have been realized on a surface of the memory component, in practice on the top of the array. More specifically, the pads are arranged over the array so that, when the memory component 1 is reversed or flipped, its pads are faced to corresponding pads of the host or SoC structure in a circuit layout that keeps the alignment of the pads with a technology similar to Flip-Chip. Other coupling techniques may be used.

The Flash memory component 1 includes at least: an I/O circuit 5, a micro-sequencer 3, an array of memory cells 6, voltage and current reference generators 7, charge pumps 2 and decoding circuitry 8, sense amplifiers 9 and corresponding latches, a command user interface, for instance a CUI block 4; some of all of the circuitry may be located at the array periphery or under the array, depending on the manufacturing technology.

The micro-sequencer 3 is substantially a memory controller that is coupled to the memory array 6. Such a controller can be a microcontroller, special purpose logic circuitry such as a Filed programmable Gate Array (FPGA) or an Application Specific Integrated Circuit (ASIC) or other suitable processor.

The memory component 1 also comprises a JTAG logic, for instance a JTAG interface adopted for the measurement and/or the test of the memory component 1 and allowing the re-use of measurement tooling.

Figure 2B:
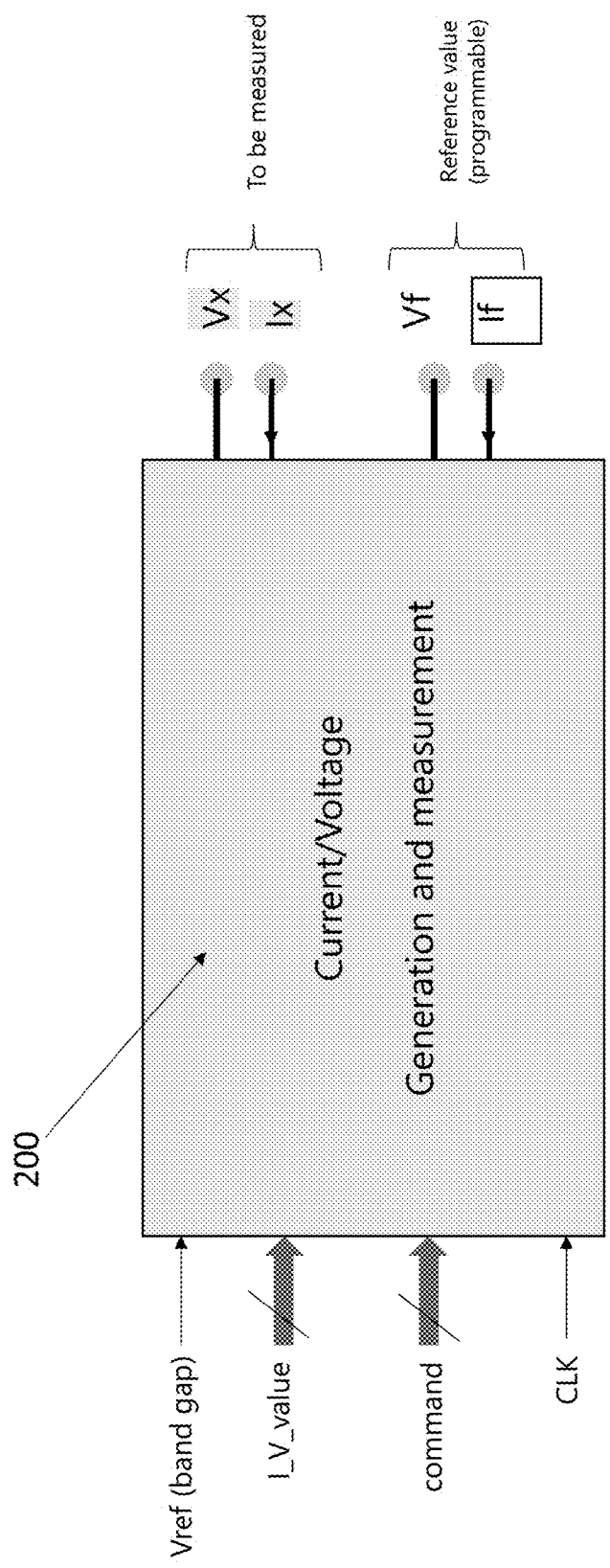
FIG. 2B shows a schematic view of a hardware block incorporated into the memory device of the present disclosure to provide internal analogic measurement mode features.

FIG. 2B shows a schematic view of a hardware block incorporated into the memory device of the present disclosure to provide internal analogic measurement mode features. In one embodiment of the present disclosure the analogic block 200 is managed by using the JTAG interface.

More particularly, the control signals are T_Reg bits contained in a special instruction register of the JTAG interface.

According to the IEEE1149 and IEEE1532 standards a JTAG interface of the memory component 1 may be completed by additional registers that may be used as shift data registers for allowing the interaction with the core of the host device 10 for instance in the writing and/or reading phases of the memory component.

However, depending on the command loaded in the IR, different registers can be combined. In this respect, the present disclosure suggests adopting a special register T_Reg including instructions to perform the analogic measurement of the analogic components of the memory device 1.

Furthermore, according to an embodiment of the present disclosure, micro sequencer or controller 3 comprises an interface with a plurality of measurement or test registers (in the following globally indicated as T_reg), each register being associated with a specific address (known as T_reg_addr), for testing the functionality of the memory component to which the controller is associated, or generally for interfacing the memory component with a testing machine and/or an external core.

The measurement mode architecture of the memory component is therefore based on these registers, which, under certain circumstances, can be written/read by the SoC controller via JTAG interface, by the test machine via JTAG interface, and by the flash array controller 3 via internal buses.

The test registers T_reg contain the instructions (e.g. parameters such as currents/voltages) for the measurement and/or test of the memory component.

In particular, test registers are organized in several banks each containing N registers (N=8, 16, etc.) and being associated with a specific address TL_addr. Each bank is also apt to drive one or more macro function (Analog or Digital).

The measurement and/or test of the memory component is therefore managed by a protocol based on a JTAG interface using the instructions of the test registers T_reg. As previously observed, the measurement and/or test can be controlled by the SoC core or controller or by an external test machine. In any case, both the approaches are based on a Built-In Self-Test (BIST) executed by the internal flash array controller 3 of the present disclosure. This approach also maintains secret the internal algorithm with sensitive technological parameters (such as timing voltages and the like).

Not all the test registers T_reg can be accessed by an external user, and a filtering block (not shown) in the controller 3 is configured to disable the access to some test registers T_reg based on a RUA signal generated by the processing unit. In other words, in some embodiments access to a subset of a plurality of test registers is limited.

In this embodiment, the filtering block is configured in such a way that, when the RUA signal is generated by the processing unit; some reserved registers are not addressable by masking the specific address of such register, and the output of said filtering block yields only the first allowed register T_reg.

The test registers T_reg that are not addressable are written by the controller 3 in a configuration register.

One embodiment of the present disclosure relates to a memory device with analog measurement mode features including:
  at least a memory component with a memory array;
  a memory controller coupled to the memory component;
  a JTAG interface in said memory controller;
  voltage and current reference generators;
  an analogic measurement mode block driven by said JTAG interface.

The memory device of the present disclosure further comprises a plurality of test registers in said JTAG interface, each register being associated with a specific address for testing the functionality of the memory component to which the controller is associated.

The analogic measurement mode block 200 shown in FIG. 2B includes also the voltage and current reference generators of the memory device.

This block 200 receives as inputs a fixed reference voltage value, for instance a Vref (band gap). A further input is represented by the I_V_Value that indicates the value of the current If or voltage Vf to be generated.

The schematic arrow indicating plural command signals represent a series of instructions received by the block 200 for providing various measurements, for instance: Measure Vx, Measure Ix, or for generating voltage or current values, for instance: Generate Vf, Generate If, or for other instructions.

The values Vx or Ix are analogic voltage and current values to be measured, while Vf and If are programmable reference values.

A clock input CLK serves as a clock an internal FSM disclosed later.

It must be noted that command, IV_Values are coming from the T_reg register (not shown) and the control signals are T_Reg bits.

Giving now a closer look to the internal structure of the analogic block 200 we can make reference to the example of FIG. 3 wherein the block 200 embraces a certain number of circuit elements disclosed hereinafter.

Figure 3:
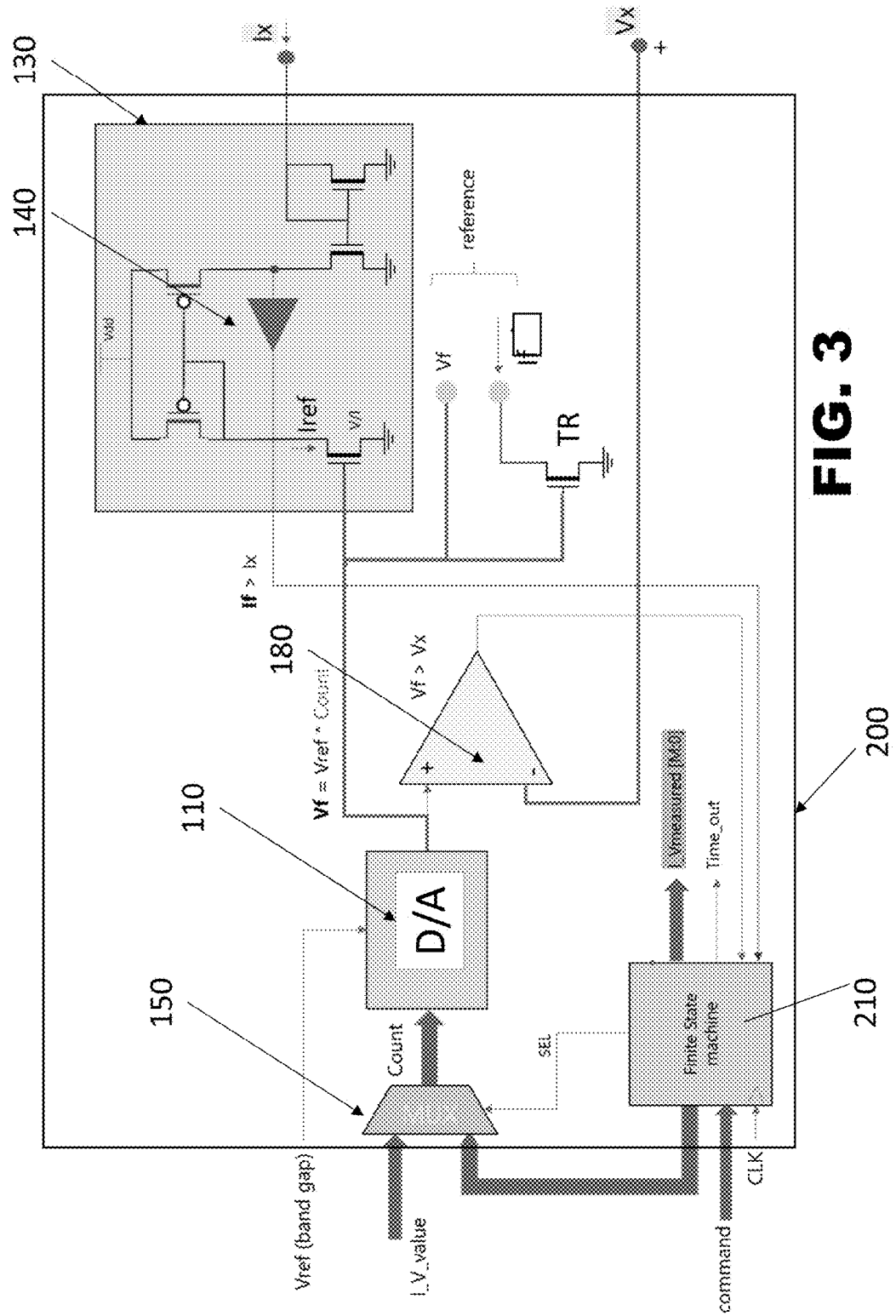
FIG. 3 is a schematic view of a first embodiment of the hardware block of FIG. 2B and according to the present disclosure.

FIG. 3 is a schematic view of a first embodiment of the hardware block of FIG. 2B and according to the present disclosure. In this Figure the depicted current-to-voltage converter is not used during voltage measurement or generation.

The block 200 includes a low voltage detector comprising:
  a comparator 180 receiving on a voltage input a voltage value to be detected;
  a digital to analog converter 110 coupled to a reference voltage potential and having an output connected to other input of said comparator;
  a Finite State Machine 210 receiving the output of said comparator and producing digital outputs for the inputs of said memory controller.

The D/A converter 110 is coupled to a stable reference voltage potential Vref generated for instance by an analogic bandgap generator and receives a digital input signal Count.

The reference voltage Vref (band gap) is to be considered as an external voltage value. A normal value for a bandgap reference could be about 1.2 Volt even if this value is just indicative. A different stable voltage generator may be used to provide Vref.

The output of the D/A converter 110 is an analogic value Vf=Vref*Count and is applied to the non-inverting input (+) of the comparator 180.

The comparator 180 has a second inverting (−) input receiving the voltage value Vx to be measured. The example reported herewith should be considered as a schematic indication that the inverting input of the comparator 180 is connected to a node point or to a terminal of the memory portion or component wherein a voltage potential Vx is applied and such a potential must be measured with great precision obtaining a value not affected by noise.

This basic structure of the comparator 180 and converter 110 has been further improved by the association of a Finite State Machine (FSM) 210.

The Finite State Machine 210 is a complex logic portion capable to execute algorithms. In the subsequent part of the present disclosure we will provide an example of an algorithm executed by the Finite State Machine 210.

This Finite State Machine 210 operates according to a clock signal CLK of the memory component and received on one input. The FSM receives also as a further input a Command signal issued by the internal memory controller to execute properly the operation that the internal firmware can require depending on the access phase to the memory array. As an alternative, the command signal may arrive from a host device coupled to the memory component or issued by a controller of the System-on-Chip hosting the embedded memory component A multiplexer 150 is provided between the Finite State Machine 210 and the digital input of the D/A converter 110. A selection signal SEL is produced by the Finite State Machine 210 to drive the multiplexer 150 and select the proper path for the input signal to the output of the multiplexer.

The output of the multiplexer 150 is a Count digital input for the D/A converter 110.

This multiplexer 150 receives as a first input a logic value corresponding to a voltage or a current measurement and on a second input the output of the Finite State Machine 210.

The output value of the comparator 180 is applied as a feedback input to the Finite State Machine 210. This output value Vf is outputted when it is greater than a voltage value Vx to be measured.

In other words, the output value Vf of the comparator 180 is triggered when the voltage value Vf is greater than the voltage value Vx to be measured. A current-to-voltage converter 130 is depicted also in FIG. 3, however it is not used during voltage detection and measurement nor during reference voltage generation. Converter 130 and its functionality will be described below with reference to current detection and measurement and reference current generation.

Moreover, if the measurement is performed for a time interval of a certain duration it is possible to obtain an average value Vx that is less and less affected by possible noise.

In this respect, the Finite State Machine 210 is settable with a programmable Time_out value that represents the max duration of the time interval for performing the measurement of the voltage value Vx.

Just to give an example of a possible algorithm that the Finite State Machine 210 may execute to measure a voltage value Vx, we are reporting hereinafter a list of instructions and parameters that have been adopted for reaching the required measurement.

```
N = max measures attempt
Wait (T0) u-second   (Vx is hopefully a stable value)
Step 1: N++;
The FSM looking for the counter value that provides Vf>Vx
Count_H ← counter
Count_L ← counter − 1
Set a Timer ΔT = T1
do {
    // Is Vx stable? Is it out of ΔV?
    if ((Vrif * Count_H) <Vx | | (Vrif * Count_L) > Vx )
        wait (T2) go to step 1
    } while ((elapsed time < ΔT ) | | k>N)
If (k<=N) I_Vmeasured [M:0] = [Vrif (Count_H)−Vrif (Count_L)]/2
Else Time_out ← 1
```

It should be noted that the Finite State Machine 210 finds the value in a sequential manner or, as an alternative, in a dichotomic way or with any other method that can speed up the finding of the final value.

Figure 4:
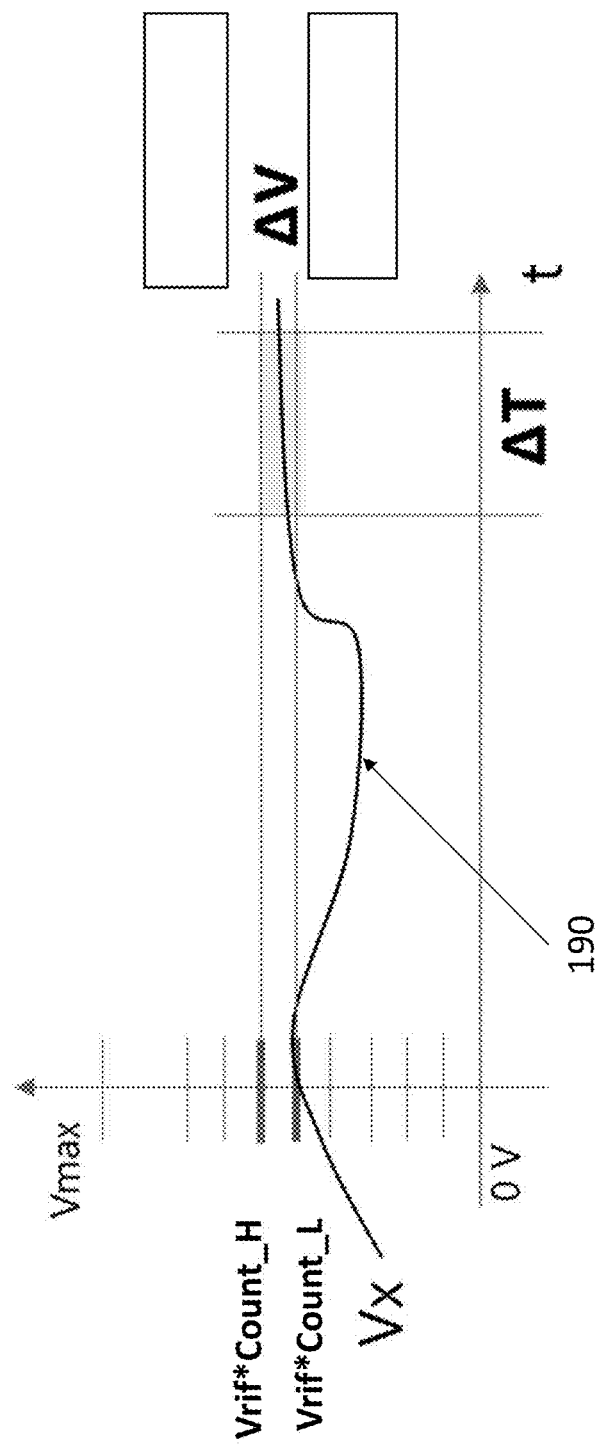
FIG. 4 is a diagram showing a measurement of a voltage value Vx obtained with the block of FIG. 3.

As shown in the diagram of FIG. 4, during the time interval ΔT the detected voltage value Vx remains substantially stable within an upper limit Vrif*Count_H and a lower limit Vrif*Count-L. The window delimited by the upper and lower voltage limits of the time interval ΔT is programmable by the user of the memory component.

Moreover, the FSM 210 is always capable to detect the possible presence of noise since the detected voltage value Vx must remain within the upper and lower limits above reported and when the detected value is outside the expected range, like for instance in the portion of the diagram indicated by the number 190, the measurement is repeated automatically.

FIG. 4 is a diagram showing a measure of a voltage value Vx obtained with the block of FIG. 3. As shown in the diagram of FIG. 4, during the time interval ΔT the detected voltage value Ix remains substantially stable within an upper limit Vrif*Count_H and a lower limit Vrif*Count-L. The window delimited by the upper and lower voltage limits of the time interval ΔT is programmable by the user of the memory component.

Moreover, the FSM is always capable to detect the possible presence of noise since the detected voltage value Vx must remain within the upper and lower limits above reported and when the detected value is outside the expected range, like for instance in the portion of the diagram indicated by the number 190, the measurement is repeated automatically.

The numeric value N represents the maximum number of attempts that the detector should perform for obtaining the required measured value Vx. The other time T0, T1 and T2 are time parameters measured from a common origin The reported parameters N, T0, T1, T2 are all programmable in the sense that their value may be set according to the quality and reliability of the measurement to be performed. Even the time interval ΔT is a parameter that may be programmed.

Just to give an indication of a value assignable to ΔT it may be set in few tens of milliseconds.

Now, the detector of the present disclosure may be used for measuring also a current value, for instance a current value Ix.

Figure 5:
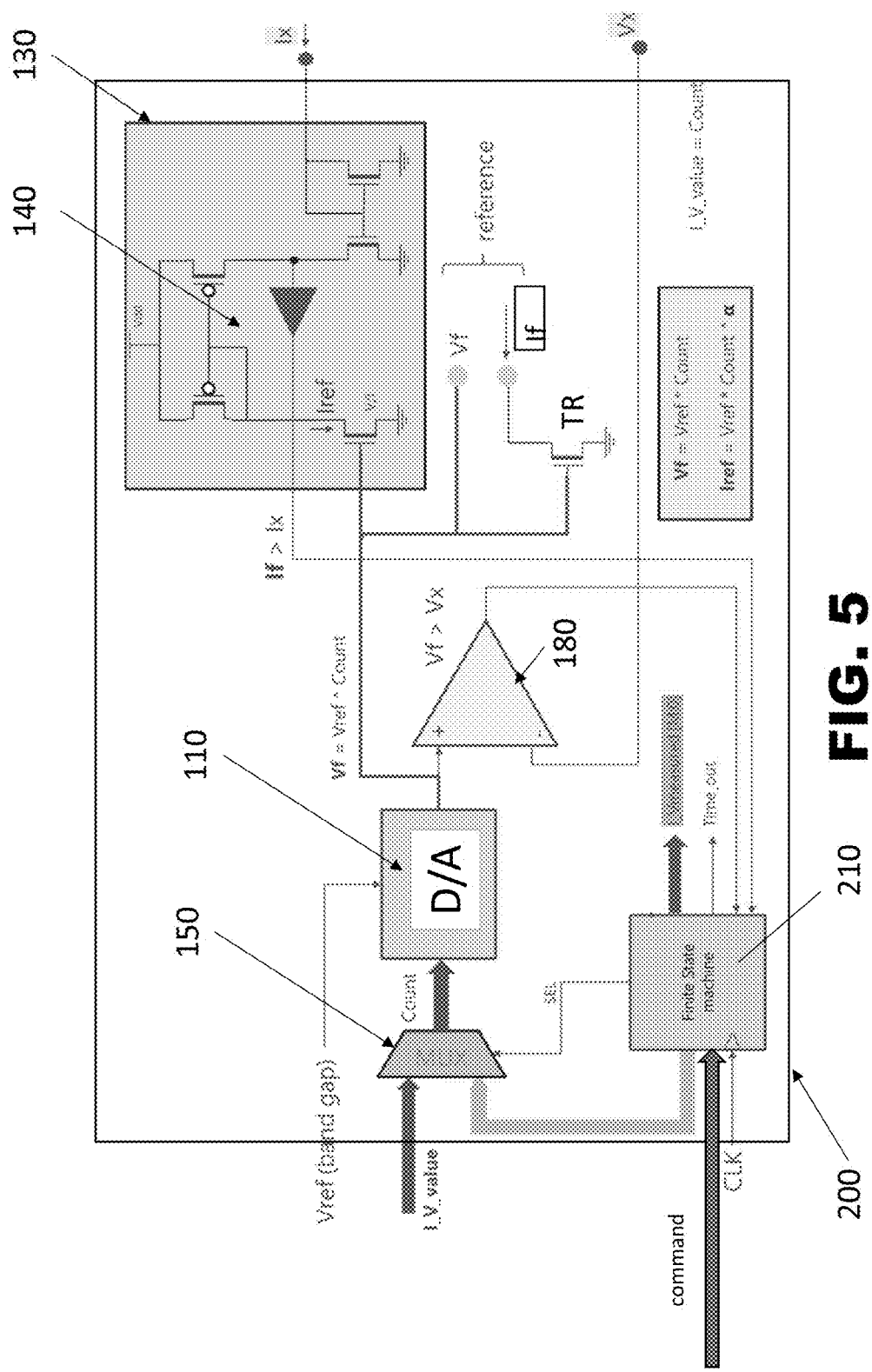
FIG. 5 is a schematic view of an alternative embodiment of the hardware block of FIG. 2B according to the present disclosure.

FIG. 5 is a schematic view of an alternative embodiment of the hardware block of FIG. 2B according to the present disclosure and more specifically for current measurements. Several elements in FIG. 5 are the same as those of FIG. 3 described above; however, some of them (such as voltage comparator 180) are not used during operation as current detection and measurement and reference current generation as better explained below. The basic portion of the detector disclosed herewith is structured in a similar fashion as the detector described with reference to FIG. 3; however, instead of voltage comparator 180 a converter 130 from current to voltage is used.

The structure of this converter 130 is based on a current mirror including a differential cell 140 comprising PMOS and NMOS transistors.

One input of the current mirror is the current value Ix to be measured. In this respect, we must intend that current input terminal of the converter 130 corresponds to a node point or to a terminal of the memory portion or component wherein a current value Ix is flowing and such a current value must be measured with great precision obtaining a value not affected by noise. In other words, the current to voltage converter has an input node on a first leg coupled to a node of a circuit in the memory component, the circuit configured to drain the current Ix.

For completeness sake it should be noted that the differential cell 140 of the current mirror includes a first leg associated to the input current value Ix and a second leg associated to the output of the D/A converter 110.

More particularly, the output of the D/A converter 110 is applied to a gate of an NMOS transistor of the second current mirror leg draining a reference current If. The voltage value Vf at the output of the D/A converter is proportional to the reference voltage Vref (band gap) and is further applied to the gate terminal of a buffer transistor TR having conducting terminal linked between the reference current If node and a ground potential reference. Transistor TR further mirrors the current Iref in the second leg of the current-to-voltage converter 130, making it possibly available at its drain node.

The output of the voltage or current detector of the present disclosure is represented by a digital output of the FSM wherein a digital value I_Vmeasured [M:0] is presented to the outside world, for instance the SoC controller.

As previously disclosed with reference to the voltage detector, the Finite State Machine 210 receives as input an output value If outputted by the converter 130 and is capable to issue digital values for the input of the D/A converter 110.

Similarly, to the previous schematic example of FIG. 3, the multiplexer 150 receives as input the signal output of the FSM 210 and as a further input a digital current/voltage value I_V_value.

Similarly, to the example of the voltage detector, it is proposed herewith an algorithm that the Finite State Machine 210 may execute to measure a current value Ix. The algorithm includes a list of instructions and parameters that have been adopted for reaching the required measurement.

```
N = max measures attempt
Wait (T0) u-second  (Ix is hopefully a stable value)
Step 3: N++;
The FSM looking for the counter value that provides If>Ix
Count_H ← counter
Count_L ← counter − 1
Set a Timer ΔT = T1
do {
    // Is Ix stable? Is it out of IV?
    if ((Vrif * Count_H * α) <Ix || (Vrif * Count_L * α) > Ix )
        wait (T2) go to step 3
    } while ((elapsed time < ΔT ) || k>N)
If (k<=N) I_Vmeasured [M:0] = α * [Vrif (Count_H)−Vrif (Count_L)]/2
Else Time_out ← 1
```

As previously disclosed, the numeric value N represents the maximum number of attempts that the detector should perform for obtaining the required measured value Ix. The other time T0, T1 and T2 are time parameters measured from a common origin.

The reported parameters N, T0, T1, T2 are all programmable in the sense that their value may be set according to the quality and reliability of the measure to be performed. Even the time interval ΔT is a parameter that may be programmed.

Figure 6:
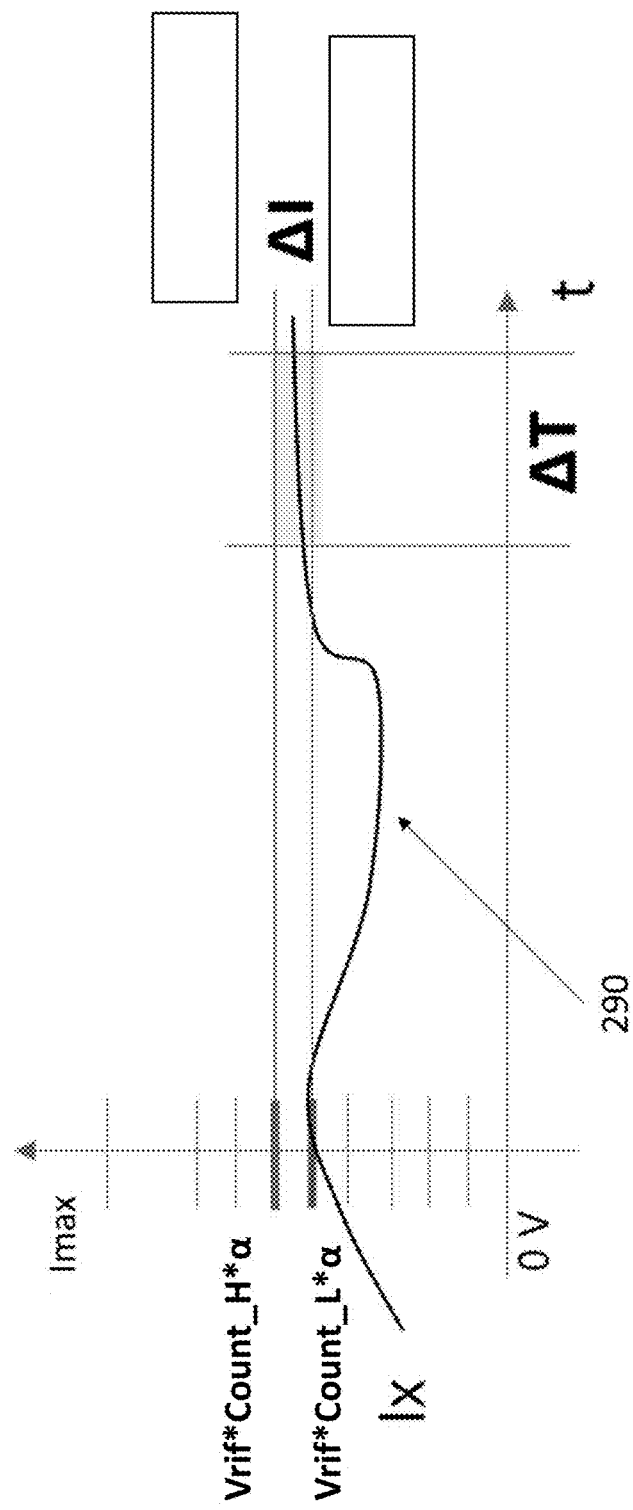
FIG. 6 is a diagram showing a measurement of a current value Ix obtained with the block of FIG. 5.

FIG. 6 is a diagram showing a measurement of a current value Ix obtained with the block of FIG. 5. As shown in the diagram of FIG. 6, during the time interval ΔT the detected current value Ix remains substantially stable within an upper limit given for instance by Irif*Count_H*α=Vrif*Count_H and a lower limit given by Irif*Count_L*α=Vrif*Count_L. The figure reports a scale factor α (alpha) to allow the proper comparison; a is a conversion factor from voltage to current (e.g., such that Vrif*Count_L*α corresponds to Irif*Count_L and Vrif*Count_H*α corresponds to Irif*Count_H). The window delimited by the upper and lower current limits of the time interval ΔT is programmable by the user of the memory component.

Moreover, the FSM is always capable to detect the possible presence of noise since the detected current value Ix must remain within the upper and lower limits above reported and when the detected value is outside the expected range, like for instance in the portion of the diagram indicated by the number 290, the measurement is repeated automatically.

One embodiment of the present disclosure relates to a method to operate a memory device including at least a memory array and a memory controller, the method comprising:
  driving by the memory controller an analogic measurement block through a JTAG interface,
  generating voltage and/or current reference values based on the driving, and;
  detecting that the generated voltage and/or current is correct.

Figure 7:
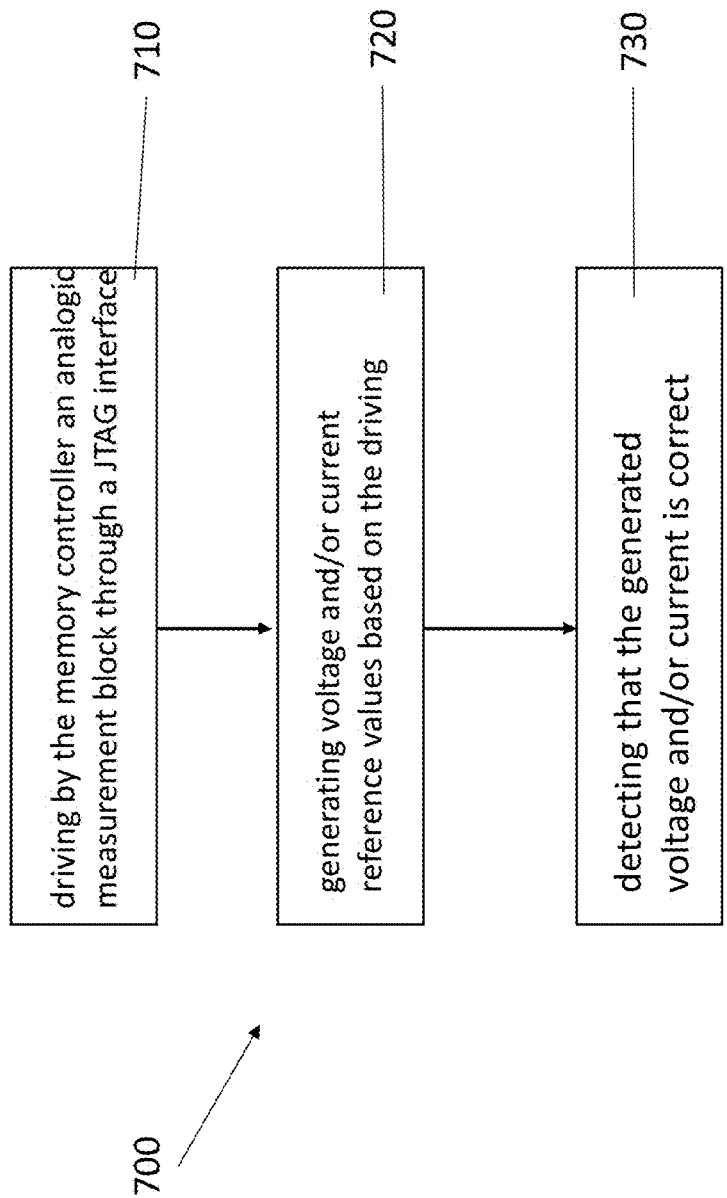
FIG. 7 shows a block diagram of a method according to the present disclosure.

FIG. 7 shows a block diagram of a method 700 according to the present disclosure.

According to method 700 a memory device including at least a memory array and a memory controller may be operated.

Method 700 comprises, at block 710 driving by the memory controller an analogic measurement block through a JTAG interface. The driving may be carried out according to the embodiments described above with reference to FIGS. 1 to 6. For example, commands may be issued to Finite State Machine 210 by the JTAG interface in controller 3.

Method 700 comprises, at block 720, generating voltage and/or current reference values based on the driving. The generating voltage and/or current may be implemented by Current/Voltage generation and measurement block 200 described in FIG. 2B and in more details 3 and 5, for example.

Method 700 further comprises, at block 730, detecting that the generated voltage and/or current is correct. Generated voltage or current detection may be implemented by the circuits described in FIGS. 3 and 5, in some embodiments.

Method 700 may further comprise generating instructions by at least a test register of said JTAG interface for said analogic measurement block. In some embodiments, method 700 may also comprise limiting access to a subset of a plurality of test registers, as described above. In some embodiments, method 700 comprises applying to an input of a comparator a voltage value Vx to be detected and/or applying to an input of a current to voltage converter a current value Ix to be detected. Method 700 may also comprise feeding the comparator output and the current to voltage converter output to corresponding inputs of a Finite State Machine and applying digital outputs of said Finite State Machine to a digital to analog converter coupled to a reference voltage potential and having an output connected to another input of said comparator for detecting an average voltage value or an average current value in a time interval One of the advantage of the method of the present disclosure is given by the presence of a on board mechanism for measuring voltage values V and current values I related to the flash array without exposing the cells terminal to any contact from an external component, for instance a host device or a SoC to whom the memory is associated. This feature has the great advantage to permit to protect some technological secret not directly measurable from outside the memory component thus rendering the memory device more robust against attacks directed to detect process parameter hacking direct measurement on flash cells.

In the previous description numerous specific details are discussed to provide a thorough and enabling description for embodiments of the present technology.

However, one skilled in the relevant art will recognize that the disclosure can be practiced without one or more of the specific details. In other instances, well-known structures or operations often associated with memory devices are not shown, or are not described in detail, to avoid obscuring other aspects of the technology. For example, several functional components of memory devices and/or memory systems that are well-known to those skilled in the art are not discussed in detail below (e.g., circuit components such as multiplexers and decoders, data structures such as address registers and data registers, etc.).

In general, it should be understood that various other devices, systems, and methods in addition to those specific embodiments disclosed herein may be within the scope of the present technology.

The invention claimed is:

1. A memory device, comprising:
a memory component having a memory array;
a memory controller coupled to the memory component;
a Joint Test Action Group (JTAG) interface in the memory controller;
voltage and current reference generators;
a voltage detector, comprising:
    a comparator configured to receive, on a voltage input, a voltage value to be detected;
    a digital to analog converter coupled to a reference voltage potential and having an output connected to a different input of the comparator; and
    a Finite State Machine receiving an output of the comparator and configured to produce digital outputs for inputs of the memory controller; and
an analogic measurement block driven by the JTAG interface.

2. The memory device of claim 1, comprising a plurality of test registers in the JTAG interface, wherein, each register is associated with a specific address for testing the functionality of the memory component.

3. The memory device of claim 1, wherein the JTAG interface includes a test register configured to generate instructions for the analogic measurement block.

4. The memory device of claim 1, wherein the voltage and current reference generators are incorporated into the analogic measurement block.

5. The memory device of claim 1 further comprising a multiplexer between the digital outputs of the Finite State Machine and the inputs of the digital to analog converter.

6. The memory device of claim 5, wherein the Finite State Machine is configured to issue a selection signal for enabling the multiplexer.

7. The memory device of claim 1, wherein the voltage input of the comparator is an inverting input of the comparator.

8. The memory device of claim 1 further comprising a current to voltage converter configured to receive as input a current value to be detected and having an output connected to the Finite State Machine.

9. The memory device of claim 8, wherein the current to voltage converter includes a current mirror.

10. An apparatus, comprising:
a host device;
a memory component with analog measurement mode features coupled to the host device; the apparatus further comprising:
    a memory array in the memory component;
    a memory controller coupled to the memory component;
    a Joint Test Action Group (JTAG) interface in the memory controller;
    voltage and current reference generators; and
    an analogic measurement block driven by the JTAG interface; and
an analogic measurement block that includes a current detector comprising;
    a current to voltage converter configured to receive as inputs a current value Ix to be detected and having an output connected to a Finite State Machine;
    the Finite State Machine configured to produce digital outputs for the inputs of the memory controller; and
    a digital to analog converter coupled to a reference voltage potential and having an output connected to a transistor of the current to voltage converter.

11. The apparatus of claim 10 further comprising a multiplexer between the digital outputs of the Finite State Machine and the transistor of the current to voltage converter.

12. The apparatus of claim 10, wherein the operation of the Finite State Machine is scheduled by a clock signal of the memory component.

13. The apparatus of claim 10, wherein the current to voltage converter has an input node on a first leg coupled to a node of a circuit in the memory component, the circuit in the memory component configured to drain the current Ix.

14. The apparatus of claim 10 further comprising a voltage comparator receiving as input a voltage Vx and having an output connected to the Finite State Machine.

15. A method to operate a memory device including a memory array and a memory controller, the method comprising:

driving by the memory controller an analogic measurement block through a Joint Test Action Group (JTAG) interface, generating voltage and/or current reference values based on the driving;

detecting that the generated voltage and/or current is correct;

applying, to an input of a comparator, a voltage value to be detected;

applying, to an input of a current voltage converter, a current value to be detected;

feeding the comparator output and the current to voltage converter output to corresponding inputs of a Finite State Machine; and applying digital outputs of the Finite State Machine to a digital to analog converter coupled to a reference voltage potential and having an output connected to another input of the comparator for detecting an average voltage value or an average current value in a time interval.

16. The method of claim 15 further comprising generating instructions by at least a test register of the JTAG interface for the analogic measurement block.

17. The method of claim 15 further comprising limiting access to a subset of a plurality of test registers.

* * * * *